(12) United States Patent
Landheer

(10) Patent No.: US 9,654,117 B1
(45) Date of Patent: May 16, 2017

(54) DIGITAL PHASE-LOCKED LOOP HAVING DE-COUPLED PHASE AND FREQUENCY COMPENSATION

(71) Applicant: COOPER TECHNOLOGIES COMPANY, Houston, TX (US)

(72) Inventor: Ronald Landheer, Quebec (CA)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 0 days.

(21) Appl. No.: 15/181,857

(22) Filed: Jun. 14, 2016

(51) Int. Cl.
*H03L 7/06* (2006.01)
*H03L 7/085* (2006.01)

(52) U.S. Cl.
CPC .................. *H03L 7/085* (2013.01)

(58) Field of Classification Search
USPC ................ 327/147–149, 156–158
See application file for complete search history.

(56) References Cited

U.S. PATENT DOCUMENTS

| | | | |
|---|---|---|---|
| 5,666,330 A | 9/1997 | Zampetti | |
| 7,248,124 B2 | 7/2007 | McCorquodale et al. | |
| 2007/0258524 A1* | 11/2007 | Chen | H04L 27/2662 375/260 |
| 2009/0112471 A1 | 4/2009 | Hayashi | |
| 2015/0311906 A1* | 10/2015 | Nilsson | H03L 7/23 331/17 |
| 2015/0312078 A1* | 10/2015 | Bogdan | H04L 7/0087 375/226 |
| 2016/0285467 A1* | 9/2016 | Reddy | H03L 7/087 |
| 2016/0294401 A1* | 10/2016 | Jin | H03L 7/0991 |
| 2016/0323091 A1* | 11/2016 | Inoue | H04L 27/38 |
| 2017/0005666 A1* | 1/2017 | Staszewski | H03L 7/0992 |

* cited by examiner

*Primary Examiner* — Adam Houston
(74) *Attorney, Agent, or Firm* — Eckert Seamans; Philip Levy

(57) ABSTRACT

An integrated circuit device implementing a digital phase-locked loop includes a measure period component, an averager component, a generator component, and a compensator component. In the digital phase-locked loop implementation, phase compensation and frequency compensation are separated from one another.

36 Claims, 1 Drawing Sheet

US 9,654,117 B1

DIGITAL PHASE-LOCKED LOOP HAVING DE-COUPLED PHASE AND FREQUENCY COMPENSATION

BACKGROUND OF THE INVENTION

1. Field of the Invention

The present invention pertains to phase-locked loop systems, and, in particular, to a digital phase-locked loop implementation wherein phase compensation and frequency compensation are separated (i.e., de-coupled) from one another.

2. Description of the Related Art

A phase-locked loop is a well-known feedback control system that generates an oscillating output signal having a phase that is synchronized with the phase of an oscillating input signal. The frequency of the output signal may be the same as or some fraction or multiple of the frequency of the input signal. Phase-locked loops are used in many different types of electronics applications, and can be used to perform a variety of different functions. For example, and without limitation, a phase-locked loop may be used to demodulate a signal, to recover a signal from a noisy communication channel, to generate a stable frequency at multiples of an input frequency (referred to as frequency synthesis), to generate an unmodulated signal carrying time information, or to distribute precisely timed clock pulses in digital logic circuits such as microprocessors, FPGAs and CPUs. Phase-locked loop systems may be implemented as either analog or digital circuits.

While phase-locked loop technology has been around for years, there remains room for improvement with respect thereto, especially with respect to digital phase-locked loop system.

SUMMARY OF THE INVENTION

In one embodiment, an integrated circuit device implementing a digital phase-locked loop is provided that includes a measure period component, an averager component, a generator component, and a compensator component. The measure period component is structured to receive a reference signal and determine a period of the reference signal for each of a plurality of cycles of the reference signal. The averager component is structured to receive the determined period for each of the plurality of cycles of the reference signal and determine an average period value based on the received determined periods. The generator component is structured to receive the average period value and generate an output signal, wherein the period of the output signal is based on the average period value. The compensator component is structured to receive the reference signal and the output signal, wherein the compensator component is structured to determine an offset value based on a phase difference between the reference signal and the output signal, wherein the offset value is fed back to the generator component, and wherein the generator component is further structured to apply the offset value to the output signal to synchronize the output signal with the reference signal.

In another embodiment, a method of providing digital phase-locked loop functionality is provided that includes receiving a reference signal, determining a frequency compensation value based on the reference signal, determining a phase compensation value based on the reference signal, wherein the phase compensation value is determined separately from the frequency compensation value, and generating an output signal using an oscillator signal, the frequency compensation value, and the phase compensation value.

In still another embodiment, a method of providing digital phase-locked loop functionality is provided that includes receiving a reference signal, determining a frequency compensation value based on the reference signal, determining a phase compensation value based on the reference signal, wherein the phase compensation value is determined separately from the frequency compensation value, and generating a plurality of output signals using a oscillator signal, the frequency compensation value, and the phase compensation value.

DETAILED DESCRIPTION OF EXEMPLARY EMBODIMENTS

Figure 1:
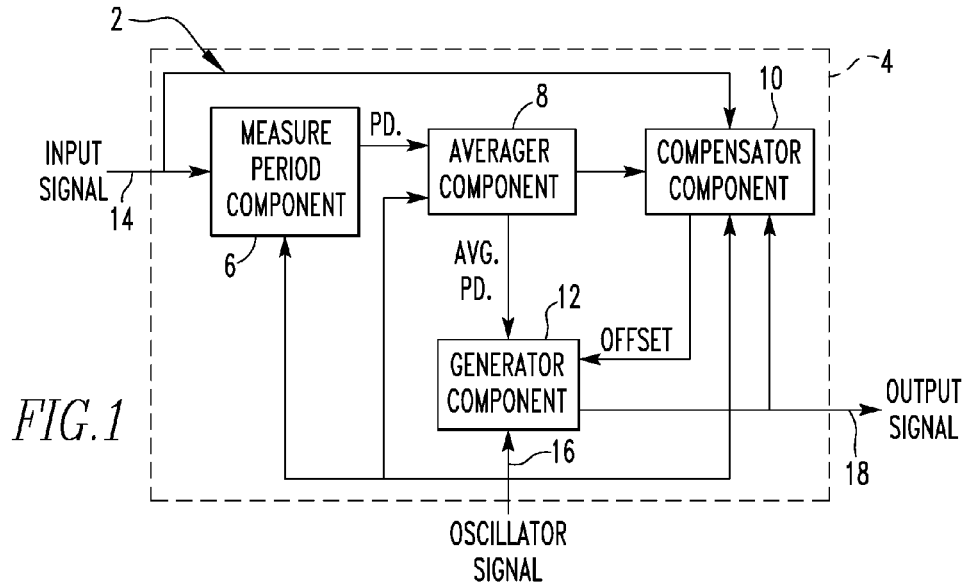
FIG. 1 is a schematic diagram of a digital phase-locked loop system according to one particular, non-limiting exemplary embodiment of the disclosed concept.

As used herein, the singular form of "a", "an", and "the" include plural references unless the context clearly dictates otherwise.

As used herein, the statement that two or more parts or elements are "coupled" shall mean that the parts are joined or operate together either directly or indirectly, i.e., through one or more intermediate parts or elements, so long as a link occurs.

As used herein, the term "number" shall mean one or an integer greater than one (i.e., a plurality).

As used herein, the terms "component" and "system" are intended to refer to a computer related entity, either hardware, firmware, software, or any combination of hardware, firmware and software. For example, a component can be, but is not limited to being, a process running on a processor, a set of processes running in a field-programmable gate array (FPGA), a processor, a field-programmable gate array (FPGA), an object, an executable, a thread of execution, a program, and/or a computer. One or more components can reside within a process and/or thread of execution, and a component can be localized on one computer and/or distributed between two or more computers.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

Figure 3:
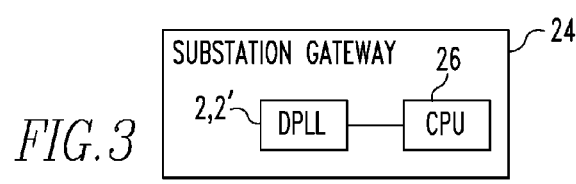
FIG. 3 is a schematic diagram of a substation gateway utilizing a digital phase-locked system according to the disclosed concept.

As described in detail herein, the disclosed concept provides a digital phase-locked loop (DPLL) system that is structured to generate an output signal corrected for both phase and frequency based on an external reference signal (e.g., an IRIG-B signal) and an oscillator signal. In the exemplary embodiment, the generated output signal is intended for use in a high-precision clock function, such as, without limitation, as a high-precision clock for a substation gateway device (FIG. 3, discussed below). The reference signal may be presented intermittently, and its source, frequency and phase may change with time. In the exemplary embodiment, the DPLL of the disclosed concept is provided as a firmware-only implementation which separates phase compensation from frequency compensation, thereby allowing for rapid and accurate simulated syntonization (frequency matching) as well as rapid and accurate phase synchronization.

In the non-limiting exemplary embodiments described herein, DPLL of the disclosed concept provides a number of advantageous features, including, without limitation, the following: (i) generation of an output signal of a pre-determined (and configurable) frequency, which may be either the same as that of the reference signal or some function of the frequency of the reference signal, (ii) reduction of the jitter of the output signal relative to the jitter of the reference signal, (iii) resilience to changes in the frequency of the reference signal, and (iv) dynamic phase offset to compensate for filtering (for noise reduction) of the reference signal. These features are accomplished by separating phase compensation from frequency compensation structurally within the DPLL of the disclosed concept.

FIG. 1 is a schematic diagram of a DPLL 2 implemented on an integrated circuit device 4 according to one particular, non-limiting exemplary embodiment of the disclosed concept. Integrated circuit device 4 may be, for example, and without limitation, a field-programmable gate array (FPGA), a complex programmable logic device (CPLD), an application specific integrated circuit (ASIC), a microprocessor, a microcontroller, or some other type of very high-speed integrated circuit (VHSIC). As described in detail herein, DPLL 2 is structured to generate an output signal corrected for both phase and frequency based on an external reference signal and an oscillator signal.

As seen in FIG. 1, DPLL 2 includes four distinct logical components implemented in firmware on integrated circuit device 4. Those four components are a measure period component 6, an averager component 8, a compensator component 10, and a generator component 12, each of which is described in detail herein. DPLL 2 receives as inputs a reference signal in the form of input signal 14, which in the non-limiting exemplary embodiment is a 1 Hz signal, and an oscillator signal 16, which in the non-limiting exemplary embodiment is a 51 MHz oscillating signal. Oscillator signal 16 may be provided by, for example and without limitation, a crystal oscillator such as a low-cost temperature compensated crystal oscillator (TCXO) that does not have the ability to change the frequency of the oscillator crystal. DPLL 2 generates and outputs an output signal in the form of output signal 18. As described herein, output signal 18 is phase synchronized with input signal 14 and has a frequency that matches the frequency of signal PPS 14 (which in the exemplary embodiment is 1 Hz).

Measure period component 6 receives input signal 14 and measures the period of input signal 14 for each of a plurality of cycles of input signal 14. As seen in FIG. 1, the measured period for each cycle is provided to averager component 8. Averager component 8 calculates a running average of a number of the periods that are measured by measure period component 6. In the exemplary embodiment, averager component 8 calculates a calibrated running average over a configurable number of entries (e.g., 8192 entries). Information regarding calculated running average of the periods is provided to generator component 16, described below. A particular exemplary embodiment of the specific information regarding calculated running average that is provided to generator component 16 is described elsewhere herein.

As seen in FIG. 1, input signal 14 is also provided to compensator component 10. Compensator component 10 provides phase compensation functionality for DPLL 2. In particular, compensator component 10 measures the phase difference between the phase of input signal 14 and the phase of the generated output signal 18. That measured phase difference is used by compensator component 10 to calculate an offset that is to be applied to output signal 18 as described below for phase compensation purposes. In the exemplary embodiment, compensator component 10 also receives oscillator signal 16, the desired offset between the input signal 14 and output signal 18, a maximum correction it may apply, and the period of input signal 14. It uses the period to determine how it should reduce the offset between the two signals (i.e. whether the signal should be "shifted left" (accelerated) or "shifted right" (delayed)). Providing the period is optional, however, as e direction could be done using a pre-set threshold. As seen in FIG. 1, the calculated offset is fed back to generator component 12. Generator component 12 generates output signal 18 using oscillator signal 16 in a manner wherein the generated output signal 18 has a period (counted as a number of ticks of oscillator signal 16) that is based on the average period information provided by averager component 8. Thus, in the illustrated exemplary embodiment, the frequency of output signal 18 is controlled to substantially match the frequency of the input signal 14. In addition, the pulse width of output signal 18 is pre-configured to be based on a certain number of ticks of oscillator signal 16. In the exemplary embodiment, the default value is 25,500,000 ticks, which accounts for a duty cycle of approximately 50%. In addition, the phase of output signal 18 generated by generator component 12 is shifted (with respect to its internal counter) by a value equal to the offset received from generator component 10. Thus, the phase of output signal 18 is synchronized with the phase of input signal 14. As noted elsewhere herein, the frequency matching (syntonization) and the phase synchronization just described are de-coupled (i.e. separated) from one another.

Figure 2:
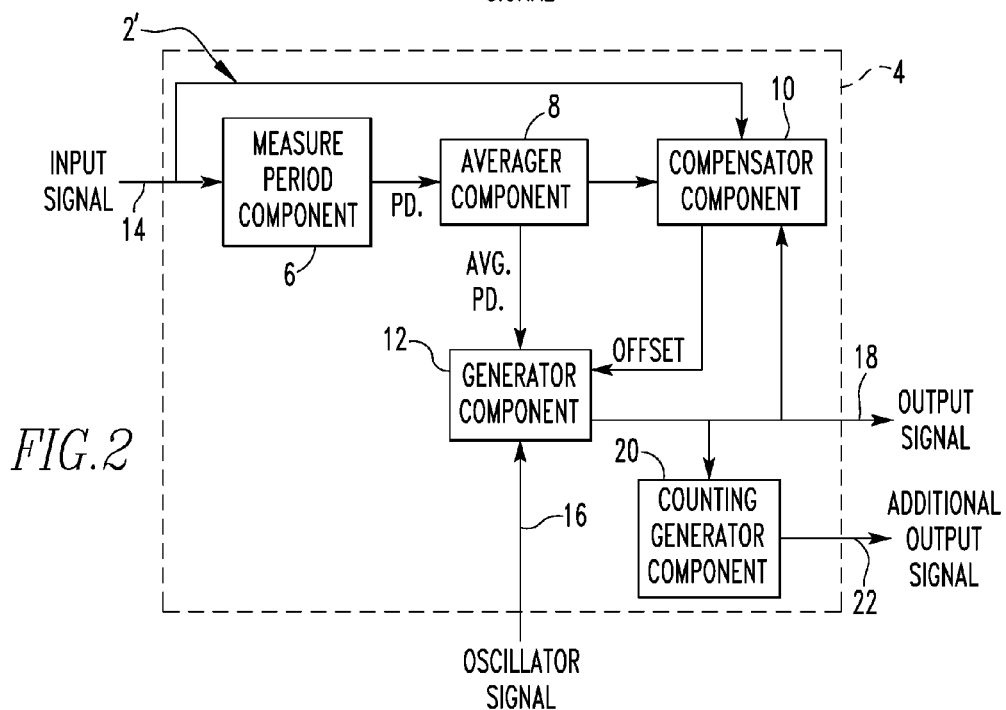
FIG. 2 is a schematic diagram of a digital phase-locked loop system according to another, alternative particular, non-limiting exemplary embodiment of the disclosed concept.

FIG. 2 is a schematic diagram of an alternative DPLL 2' implemented on an integrated circuit device 4 according to another particular, non-limiting exemplary embodiment of the disclosed concept. DPLL 2' is similar to DPLL 2, and like parts are labeled with like reference numerals. However, as seen in FIG. 2, DPLL 2' includes an additional component (that may be a firmware component) that enables generation of an additional output signal. In particular, DPLL 2' includes a counting generator component 20 that receives output signal 18. Counting generator component 20 is structured to be configurable to generate an additional output signal 22 that is synchronized with input signal 14 and that has a frequency that is a function of the frequency of output signal 18 such that the frequency of additional output signal 22 is higher than the frequency of output signal 18. In the exemplary embodiment, additional output signal 22 is a 1 kHz signal. In still another embodiment, rather than providing both output signal 18 and additional output signal 22 as shown in FIG. 2, only additional output signal 22 may be provided.

Within the implementations of DPLL 2 or DPLL 2' described herein, the following use-cases can be identified: (1) initial boot-up, (2) synchronization with a newly-present external reference signal, and (3) loss of the external reference signal.

With respect to use-case (1), when integrated circuit device 4 first starts executing its firmware as described herein, generator component 12 starts generating a signal of approximately 1 Hz, based on an expected frequency of oscillator signal 16. This signal is not synchronized with any external reference signal. Hence, compensator component 10 is put in a state where it can be quickly synchronized with any external reference signal, allowing for a maximum compensation of half the expected period of the input signal, or approx. 500 ms (which allows synchronization to the external reference signal in a single step). Integrated circuit device 4 will then provide input signal 14 from, for example, an on-board real time clock (RTC) of an associated CPU or similar device, to which DPLL 2 (or 2') will synchronize as described herein. Hence, the first synchronization step (from boot-up to the first synchronized output signal 18 being produced) takes less than two seconds. Once synchronized, the state of compensator component 10 is progressively adjusted to allow for a maximum compensation of 10 μs (which still allows for synchronization, but also allows the system to generate a valid IRIG-B signal while still compensating for the offset).

With respect to use-case (2), when a new external reference signal is present and selected by an associated CPU or similar device, DPLL 2 (or 2') will synchronize to that new signal. DPLL 2 (or 2') includes registers that report the offset calculated by compensator component 10. According to an aspect of the disclosed concept, the output signal 18 of DPLL 2, or the output signals 18 and 22 of DPLL 2' may be used to generate an IRIG-B time signal with an accuracy that is encoded in the generated signal itself (according to the signal's format, which may, for example, conform to IEEE C37.118.1). According to this aspect of the disclosed concept, generation of said IRIG-B signal may be interrupted if the offset calculated by compensator component 10 is too great to continue generating the signal with the accuracy reported in the encoded signal. In this case, DPLL 2 (or 2') is put in a "discrete break" state, which is analogous to the initial boot-up state described above in that it allows compensator component 10 to compensate for the current offset in a single step and then progressively reduces the maximum compensation until it reaches 10 μs. This state allows this aspect of the disclosed concept to rapidly resume generating the IRIG-B signal with the accuracy reported in the encoded signal.

With respect to use-case (3), whenever input signal 14 is lost, it is invalidated by integrated circuit device 4. DPLL 2 (or 2') then continues generating output signal 18 and additional output signal 22, if applicable, using the most recent phase compensation and average frequency (compensated over a calibration period).

In the exemplary embodiment, the measure period component 6 is a simple counter which counts the number of clock ticks between two pre-defined (e.g., rising) edges of input signal 14, and outputs the number of ticks. It contains a rudimentary filter, which filters out pulses with less than a minimum period or more than a maximum period, which is intended to prevent switching from one source to another to introduce bad measurements in the system. In the exemplary embodiment, measure period component 6 has three states: an idle state, a start measuring state, and a measuring state. In the idle state, the measure period component 6 will reset its counter to 0 whenever a rising edge occurs in input signal 14, and will switch to the start measuring state on the second rising edge if the counter is within the valid range of a period. If the measure period component 6 measures a period that is smaller than the minimum period or greater than the maximum period, it will transition back to the idle state.

Also in the exemplary embodiment, the averager component 8 calculates a running average over the last N (up to 8192) period values, and outputs (i) an average value which is the calculated average rounded down to the nearest integer, and (ii) a remainder value. The period of output signal 18 is determined by generator component 12 by that average value, with the remainder value being spread among the number of periods that were measured. There are two ways this spreading may be done: either the first r periods have one extra "tick" (where r is the remainder), or r extra ticks are evenly spread among the n periods generated, where r is the remainder an n is the number of measured periods (and n<N where N is the maximum number of periods measured). Spreading is done by finding the largest divider D<N into which both n and r may be divided, and producing one extra tick for every r/D periods, the no extra tick for the next (n−r)/D periods.

Moreover, in the exemplary embodiment, the compensator component 10 calculates the offset relative to the pulse as it would be generated without regard for synchronization and is therefore dependent only on the startup time of integrated circuit device 4. In other words, in order to generate output signal 18 that is synchronized with input signal 14, the offset has to be configured to compensate for the time at which DPLL 2 (or 2') started. For example, if the system started at 12:21:32.127, and both the input signal 14 and the output signal 18 are 1 Hz signals, the offset to apply to output signal 18 in order to synchronize with input signal 14 would be 1000−127=873 ms (so, approximately 44,523,000 clock ticks for a 51 MHz clock).

Further, in the exemplary embodiment, compensator component 10 maintains two frozen counters, one for each signal 14, 18, used to timestamp the rising edges of those signals. Three processes drive these two counters: one to advance an underlying running counter (to use a single reference for both frozen counters) and one for each signal 14, 18 to freeze the counter values as needed. Either of these processes can trigger a distance calculation which can, in turn, trigger a state change in the offset calculation activating it. The distance calculation is implemented in a separate process and, in the exemplary embodiment, is not pipelined, and produces an absolute distance-and-direction value between the two signal's rising edges as well as a sum total distance for the two latest rising edges. The sum total distance compensates for random jitter of the input signals such that if input signal 14 has a jitter of n μs relative to output PPS signal (or vice-versa), and the distance between the two signals 14, 18 oscillates between −n and +n μs, the total distance will be 0. Hence, the sum total distance is used to determine the direction of the compensation to be performed (i.e. if the two composing distances are positive, the total distance will be positive; if the two are negative, the total will also be negative; if one is positive and one is negative, the direction will be that of the greater of the two distances). The calculation of the applicable correction is pipelined using a six-state state machine (of which the first state is "idle", so it is done in five steps). The state machine is used to pipeline the calculation. The final value of the offset is available approximately 160 ns after the rising edge of the input signal that triggers the calculations in this embodiment.

The DPLL implementation described herein having decoupled phase and frequency compensation may be used in a number of different electronics applications. One particular, non-limiting exemplary application is shown in FIG. 3. More specifically, FIG. 3 shows a substation gateway 24 implemented in accordance with the disclosed concept. As is well known, a substation gateway is used in a power systems substation to perform various operations such as data acquisition and distribution, protocol translation, and remote access to substation intelligent electronic devices. Substation gateway 24 shown in FIG. 3 includes a CPU 26 that is operatively coupled to DPLL 2, 2' as described herein. In this implementation, DPLL 2, 2' may be used to provide a one-pulse-per-second interrupt to CPU 26 and/or a 1 kHz signal that may be used for IRIG-B signal generation. In an alternative embodiment, substation gateway 24 may include a plurality of distinct instances of DPLL 2, 2' configured to perform different functions.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. An integrated circuit device implementing a digital phase-locked loop, comprising:
   a measure period component structured to receive a reference signal and determine a period of the reference signal for each of a plurality of cycles of the reference signal;
   an averager component structured to receive the determined period for each of the plurality of cycles of the reference signal and determine an average period value based on the received determined periods;
   a generator component structured to receive the average period value and generate an output signal, wherein a period of the output signal is based on the average period value; and
   a compensator component structured to receive the reference signal and the output signal, wherein the compensator component is structured to determine an offset value based on a phase difference between the reference signal and the output signal, wherein the offset value is fed back to the generator component, and wherein the generator component is further structured to apply the offset value to the output signal to synchronize the output signal with the reference signal.

2. The integrated circuit device according to claim 1, wherein the integrated circuit device is selected from the group consisting of a field programmable gate array, a complex programmable logic device, and an application-specific integrated circuit device.

3. The integrated circuit device according to claim 1, wherein the averager component determines the average period value based on a subset of the received determined periods.

4. The integrated circuit device according to claim 1, wherein the reference signal is a 1 Hz signal.

5. The integrated circuit device according to claim 1, wherein the reference signal is extracted from an IRIG-B clock signal.

6. The integrated circuit device according to claim 5, wherein the output signal is a 1 Hz signal.

7. The integrated circuit device according to claim 1, wherein a frequency of the output signal is a function of the frequency of the reference signal.

8. The integrated circuit device according to claim 1, further comprising a counting generator component structured to generate a second output signal.

9. Integrated circuit device according to claim 8, wherein the counting generator component generates a configured number of pulses subsequent to being reset.

10. The integrated circuit device according to claim 9, wherein the counting generator component is structured to be reset by the first output signal generated by the generator component.

11. The integrated circuit device according to claim 8, wherein a frequency of the second output signal generated by the counting generator component is a function of a frequency of the output signal generated by the generator component.

12. The integrated circuit device according to claim 8, wherein a frequency of the second output signal generated by the counting generator component is a function of the average period value.

13. The integrated circuit device according to claim 8, wherein the counting generator component is structured to generate the second output signal synchronously with the output signal generated by the generator component.

14. The integrated circuit device according to claim 1, wherein the compensator component further determines whether the offset value is within a tolerance value.

15. The integrated circuit device according to claim 14, wherein the determination of whether the offset value is within the tolerance value is used to determine whether output signal is valid.

16. A substation gateway for a power substation, comprising:
   a central processing unit; and
   an integrated circuit device according to claim 1, wherein the output signal is used to implement a clock function of the substation gateway.

17. A method of providing digital phase-locked loop functionality, comprising:
   receiving a reference signal;
   determining a frequency compensation value based on the reference signal;
   determining a phase compensation value based on the reference signal, wherein the phase compensation value is determined separately from the frequency compensation value; and
   generating an output signal using an oscillator signal, the frequency compensation value, and the phase compensation value.

18. The method according to claim 17, wherein the phase compensation value is an offset that is based on a phase difference between the reference signal and the output signal, and wherein the offset value is used as a feedback value for generating the output signal.

19. The method according to claim 18, wherein the offset further includes a pre-determined offset determined to compensate for delays introduced by noise reduction on the reference signal.

20. The method according to claim 17, wherein the frequency compensation value is an average period of the reference signal over a plurality of cycles of the reference signal.

21. The method according to claim 17, wherein a frequency of the reference signal is 1 Hz.

22. The method according to claim 17, wherein a frequency of the output signal is 1 Hz.

23. The method according to claim 17, wherein a frequency of the output signal is a function of a frequency of the input signal.

24. The method according to claim 17, further comprising generating a second output signal, wherein a frequency of the second output signal is a function of a frequency of the output signal.

25. The method according to claim 24, wherein the frequency of the reference signal is 1 Hz, the frequency of the output signal is 1 HZ and the frequency of the second output signal is 1 kHz.

26. The method according to claim 17, further comprising generating a second output signal, wherein a frequency of the second output signal is a function of a frequency of the reference signal.

27. The method according to claim 26, wherein the frequency of the reference signal is 1 Hz, the frequency of the output signal is 1 Hz, and the frequency of the second output signal is 1 kHz.

28. The method according to claim 20, further comprising determining whether the offset value is within a tolerance, wherein the output signal is generated only if the offset value is within the tolerance.

29. A method of providing digital phase-locked loop functionality, comprising:

receiving a reference signal;

determining a frequency compensation value based on the reference signal;

determining a phase compensation value based on the reference signal, wherein the phase compensation value is determined separately from the frequency compensation value; and generating a plurality of output signals using a oscillator signal, the frequency compensation value, and the phase compensation value.

30. The method according to claim 29, wherein the phase compensation value is an offset value that is based on a phase difference between the reference signal and one of the output signals, and wherein the offset value is used as a feedback for generating the one of the output signals.

31. The method according to claim 30, wherein the offset value further includes a pre-determined offset determined to compensate for delays introduced by noise reduction on the reference signal.

32. The method according to claim 29, wherein the frequency compensation value is an average period of the reference signal over a plurality of input cycles of the reference signal.

33. The method according to claim 29, wherein a frequency of the reference signal is 1 Hz.

34. The method according to claim 29, wherein a frequency of the output signal is 1 Hz.

35. The method according to claim 29, wherein a frequency of the output signal is a function of a frequency of the input signal.

36. The method according to claim 30, further comprising determining whether the offset value is within a tolerance, wherein the output signal is generated only if the offset value is within the tolerance.

* * * * *